United States Patent
Effing

(10) Patent No.: US 10,211,796 B1
(45) Date of Patent: Feb. 19, 2019

(54) COMMON MODE VOLTAGE RAMPING IN CLASS-D AMPLIFIERS MINIMIZING AM BAND EMISSIONS IN PASSIVE KEYLESS ENTRY SYSTEMS

(71) Applicant: NXP B.V., Eindhoven (NL)

(72) Inventor: Hermanus J. Effing, Overasselt (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/988,582

(22) Filed: May 24, 2018

(51) Int. Cl.
| H03F 3/217 | (2006.01) |
| H03F 1/56 | (2006.01) |
| H03F 3/195 | (2006.01) |
| G07C 9/00 | (2006.01) |
| H03F 1/02 | (2006.01) |

(52) U.S. Cl.
CPC ....... *H03F 3/2171* (2013.01); *G07C 9/00119* (2013.01); *H03F 1/0216* (2013.01); *H03F 1/565* (2013.01); *H03F 3/195* (2013.01); *H03F 2200/222* (2013.01); *H03F 2200/387* (2013.01); *H03F 2200/451* (2013.01)

(58) Field of Classification Search
CPC ...... H03F 3/2171; H03F 1/0216; H03F 1/565; H03F 3/195; H03F 2200/387; H03F 2200/451; G07C 9/00119
See application file for complete search history.

(56) References Cited

U.S. PATENT DOCUMENTS

| 5,220,272 A * | 6/1993 | Nelson | H02M 3/156 323/282 |
| 5,642,067 A * | 6/1997 | Grace | H03K 4/94 327/130 |
| 5,663,647 A * | 9/1997 | Wirth | G01R 33/3852 324/322 |
| 5,959,482 A * | 9/1999 | Fattori | H03K 17/16 326/125 |
| 9,859,008 B1* | 1/2018 | Kim | G11C 16/10 |
| 2011/0037443 A1* | 2/2011 | Yang | H02M 1/4225 323/207 |
| 2013/0141059 A1* | 6/2013 | Parkhurst | H02M 3/156 323/271 |

(Continued)

OTHER PUBLICATIONS learnemc.com, Time/Frequency Domain Representation of Signals, printed May 29, 2018, https://learnmc.com/time-frequency-domain.

(Continued)

*Primary Examiner* — Thomas D Alunkal

(57) ABSTRACT

A switching amplifier circuit (50) connected to drive an impedance-based antenna drive circuit (55) includes high side and low side switches (51-54) configured and connected to connect different reference voltages to first and second output nodes (ANTP, ANTN) in response to gating control signals during an active phase and a disabled phase, and also includes an output drive circuit (59) that provides a ramped output voltage drive signal to the first output node while the second output node is connected over the second low side electronic switch to the second reference voltage during a transition phase of operation between the disabled phase and active phase, where the ramped output voltage drive signal is characterized by a predetermined slew-rate between the second reference voltage and the first reference voltage over a specified time interval.

21 Claims, 6 Drawing Sheets

(56) References Cited

U.S. PATENT DOCUMENTS

| | | | | |
|---|---|---|---|---|
| 2014/0266112 A1* | 9/2014 | Cheng | ............... | H02M 3/156 |
| | | | | 323/282 |
| 2016/0227634 A1* | 8/2016 | Engelen | ............. | H05B 37/0245 |
| 2016/0329734 A1* | 11/2016 | Lee | ................. | H02M 3/156 |
| 2017/0153278 A1* | 6/2017 | Maschera | ............... | H03F 3/393 |
| 2017/0214342 A1* | 7/2017 | Braun | ..................... | H02P 6/14 |
| 2018/0048233 A1* | 2/2018 | Ramachandran | ....... | H02M 1/36 |

OTHER PUBLICATIONS

Bogdan Adamczyk, Spectra of Digital Clock Signals, In Compliance magazine, Mar. 31, 2017 https://incompliancemag.com/article/spectra-of-digital-clock-signals/.

John McCloskey, Effects of Rise/Fall Times on Signal Spectra, NASA, Powerpoint printed May 29, 2018.

John Rice et al., Understanding Noise-Spreading Techniques and their Effects in Switch-Mode Power Applications, 2008, https://pdfs.semanticscholar.org/5b96/036f9ebfiaba142710ff6e61613170e7db3a97.pdf.

* cited by examiner

T = the period of the repetitive waveform
τ = pulse width at the 50% points
A = pulse amplitude
$t_r$ = $t_f$ = pulse rise and fall times

COMMON MODE VOLTAGE RAMPING IN CLASS-D AMPLIFIERS MINIMIZING AM BAND EMISSIONS IN PASSIVE KEYLESS ENTRY SYSTEMS

BACKGROUND OF THE INVENTION

Field of the Invention

The present invention is directed in general to field of power amplifiers. In one aspect, the present invention relates to a method, apparatus, architecture, and system for an integrated circuit switching amplifier.

Description of the Related Art

Switching amplifiers are increasingly used to detect and reproduce audio or low-frequency (LF) signals in a variety of electronic circuit applications, such as power electronics circuits in the automotive industries as well as many other portable applications. The vast majority of these electronic circuit applications are embodied with integrated circuits. A specific example of an LF amplifier in an integrated circuit is a basic four-switch Class-D driver (or amplifier) design with output amplitude-control clamp circuitry in the form of regulators and diodes. In such driver designs, the four switches are commonly implemented as field-effect transistors (FETs) driven in common mode, with opposing-phase signals driving a pair of high-side FETs and a pair of low-side FETs. For some specific LF transmission systems, such as passive keyless automotive entry systems, it is required to control the load current over a wide range. A lower controllable load current is achieved by carefully-constructed arrangements of regulators and diodes for clamping the maximum gate and source voltages of the high-side switches. In this way, the output amplitude control provides limits on the maximum gate voltage of the high-side switches and forces them to operate in common drain (source-follower) mode in specific instances of operation, thereby effecting upper limits on certain of the voltages and on the output load current relative to desired current levels as would be set by the applied supply voltage and duty cycle of the switching.

While existing differential Class-D switching amplifiers are largely successful in boosting the maximum output power and power efficiency compared to the more classical Class(A)B amplifier topologies, there remain challenges to the control and design of such amplification circuits for a variety of applications, including but not necessarily limited to those directed to LF transmission and other switched-power amplifier applications. For example, antenna amplifiers in passive keyless entry systems are typically enabled with small duty cycles in a polling operation to minimize the average current consumption, in which case the Class-D outputs are generally pulled down to ground level when the amplifier is disabled to prevent floating output, thereby creating a floating antenna. The activation and deactivation of a differential Class-D amplifier during polling operations leads to a voltage step at one of the outputs of the differential Class-D amplifiers which will generate significant emissions in the AM radio-band that result from the cabling between the amplifier and the actual antenna. As seen from the foregoing, existing switching amplifier solutions are extremely difficult at a practical level by virtue of the challenges posed from design complexity, power control needs, undesirable emissions, and increased costs.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
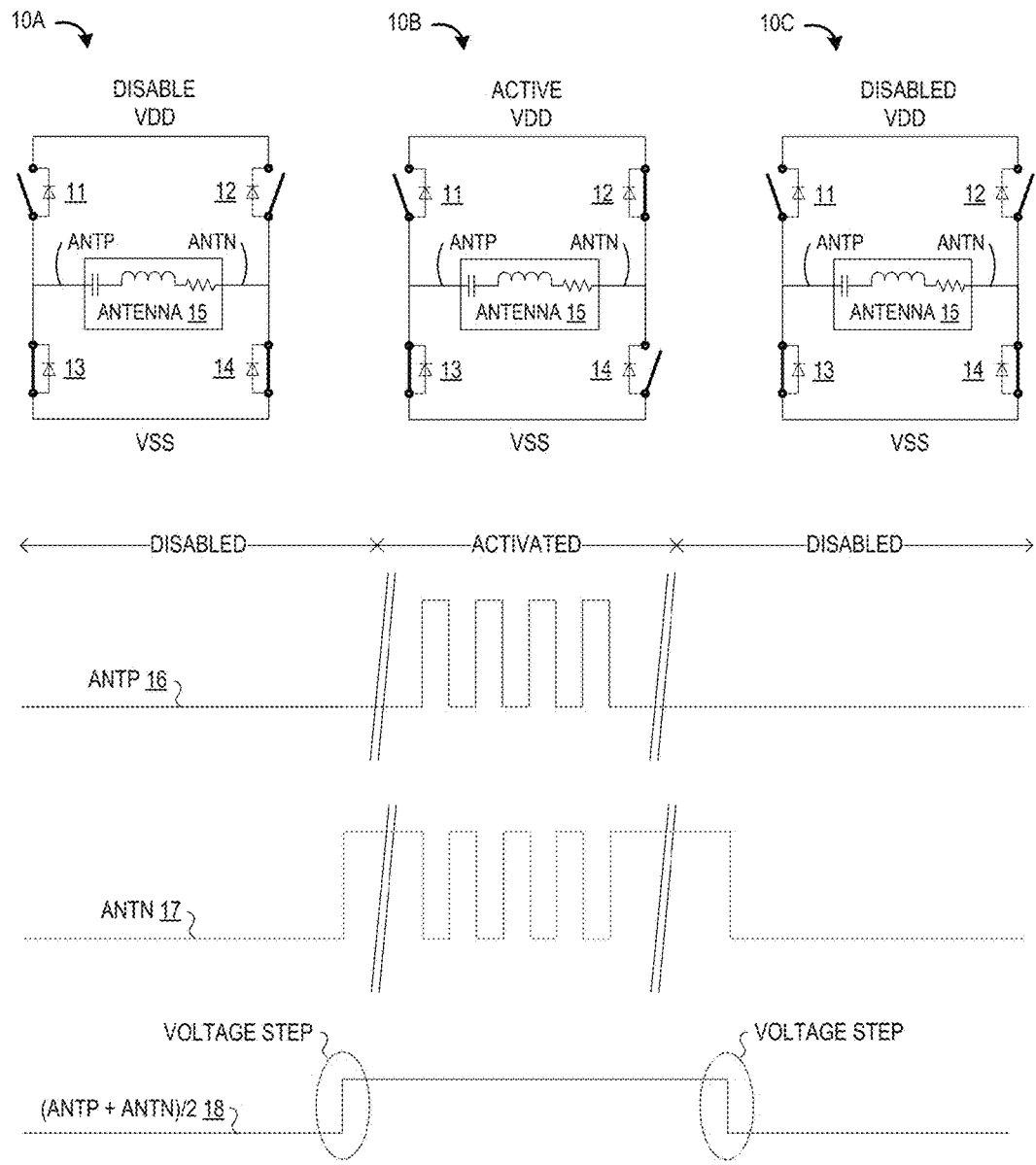
FIG. 1 illustrates a switching amplifier connected in an antenna circuit configuration along with the resulting antenna port signals generated when the switching amplifier is activated and disabled.

A high performance differential switching amplifier circuit, system, architecture, and methodology are described for boosting the maximum output power and power efficiency while reducing unwanted emissions in the AM radio-band by providing activation and deactivation sequences which use a controlled voltage ramp to transition the activation/deactivation sequences. In selected differential class-D switching amplifier embodiments, the disclosed activation and deactivation sequences are combined seamlessly using an output amplitude control which generates a voltage ramping with a defined slew-rate at one output of the differential class-D switching amplifier. In selected embodiments, the slew-rate may be a fixed, linear slew-rate and/or may be a non-linear ramp function, such as a raised-cosine ramp or root-raised-cosine ramp function. As a result, the class-D switching amplifier emissions are independent of the class-D supply voltage in the relevant performance areas. An example application is in an automotive passive keyless entry system where a class-D switching amplifier feeds an output drive circuit that is coupled to an antenna load. In such class-D switching amplifiers where FET devices rapidly switch back and forth in response to an input signal and based on a general (e.g., DC) power source, an output-amplitude control circuit is used to generate ramped drive or control (e.g., gate/source) voltages internal to the switching amplifier during activation transitions. In more specific embodiments, an amplifier circuit includes opposing-phase electronic switches, and an output drive circuit that provides a ramped output drive signal (Vdr) in response to output signals from the opposing-phase electronic switches. Each of the opposing-phase electronic switches are configured and arranged to rapidly switch back and forth in response to an amplifier input signal and based on a power source defined to provide a supply voltage to the switching amplifier circuit. Further, an output-amplitude control circuit is used to generate a ramped output (gate/source) voltage for at least one of the opposing-phase electronic switches, thereby significantly reducing unwanted emissions in the AM radio-band.

While the present disclosure may be used in a wide variety of switching amplifier designs, for the sake of brevity, the present description refers to selected switching amplifier embodiments without describing in detail conventional techniques related to signal amplification circuitry in the form of electronic switches and control circuit affecting or acting on the electronic switches and/or output-driver circuitry of the signal amplification circuitry. Furthermore, the connecting lines shown in the various figures contained herein are intended to represent example functional relationships and/or physical couplings between the various elements. In certain implementations, aspects of the present disclosure have been shown to be beneficial when used in the context of a differential Class-D amplifier and/or in connection with portable and automotive applications in the amplifiers drive antenna loads. While not necessarily so limited, various aspects may be appreciated through the following discussion of non-limiting examples which use exemplary contexts. Accordingly, aspects of the present disclosure are believed to be applicable to a variety of different types of switching amplifier circuits, systems, architectures, and methods which use control circuitry to affect or act on the electronic switches and/or output-driver circuitry so that a ramped output drive signal minimizes AM band emissions that arise from activation and deactivation of the switching amplifier.

To provide additional details for an improved understanding of the limitations of conventional switching amplifier designs, reference is now made to FIG. 1 which illustrates a switching amplifier 10 connected in different antenna circuit configurations 10A-C along with timing waveform signals 16-17 for antenna port signals generated when the switching amplifier 10 is activated and disabled. As illustrated, the switching amplifier 10 may be connected as the output stage of a high power driver which includes four high power transistors 11-14 connecting an antenna load 15 between first and second reference voltages. The high power transistors 11-14 are typically transistors that handle 0.5 A to 100 A (or more) for driving various applications, as opposed to low power transistors that are primarily used to control the operation of the various applications without directly handling the high current. On a first circuit branch, the high power transistors 11, 13 are connected in series between a first reference voltage Vdd and a second reference voltage Vss. And on the second circuit branch, the high power transistors 12, 14 are connected in series between the first and second reference voltages Vdd, Vss. As shown, an antenna load 15 is connected between a first node ANTP between the high power transistors 11, 13 and a second node ANTN between the high power transistors 12, 14. A controller (not shown) provides gate drive signals to the high power transistors 11-14 to control the direction of the current flowing through the antenna load 15 so that current flows only when activated, but not when disabled.

In order to minimize average current consumption, antenna switching amplifier 10 may be enabled with small duty cycles in a polling operation which alternates between "disabled" and "activated" modes. When disabled, the switching amplifier outputs ANTP, ANTN are generally pulled down to ground level to prevent a floating antenna output. To this end, a "disabled" switching amplifier configuration 10A is configured with open upper switches 11, 12 to disconnect the antenna load 15 from the first reference voltage Vdd, thereby pulling the first node ANTP or second node ANTN to ground Vss. In an "activated" switching amplifier configuration 10B, the switches 11-14 are selectively opened and closed using an "opposing-phase electronic switching" to develop voltages on the first and second nodes ANTP, ANTN and to direct current flow through the antenna load 15. For example, a first "ON phase" switching configuration with closed switches 11, 14 and open switches 12, 13 will cause the current to flow in a first direction through the antenna load 15, driving current through the source-drain of transistor 11 to feed the ANTP port of the antenna load 15 at the same time current is returned from its ANTN port after passing through the source-drain of transistor 14. A second opposing "OFF phase" switching configuration with open switches 11, 14 and closed switches 12, 13 drives current through the source-drain of transistor 12 to feed the ANTN port of the antenna load 15 at the same time current is returned from its ANTP port through the source-drain of transistor 13. The activation and deactivation of the transistor switches 11-14 is controlled by applying the appropriate FET gate-control signal as generated by a power transistor gate drivers (not shown). And then when the switching amplifier 10 is turned back off or "disabled" with switching amplifier configuration 10C, the upper switches 11, 12 or opened to disconnect the antenna load 15 from the first reference voltage Vdd, pulling the voltage at the first and second nodes ANTP, ANTN back to ground Vss.

The upper waveform 16 in FIG. 1 shows the first antenna port ANTP signal which transitions from a "disabled" state (e.g., ANTP=Vss) to an "activated" state (where ANTP alternates between ON and OFF phases) and back to the "disabled" state. When "activated," the ANTP port 16 of the antenna load 15 alternates between the first reference or supply voltage Vdd and the second reference or ground/common voltage Vss. In similar fashion, the middle waveform 17 shows the ANTN port of the antenna load 15 transitioning from a "disabled" state (e.g., ANTN=Vss) to an "activated" state (where ANTN alternates between ON and OFF phases) and back to the "disabled" state. However, when activated, the ON and OFF phases of the ANTN port 17 alternate in opposite phase from the upper waveform 16. The activation and deactivation of the switching amplifier 10 leads to a voltage step at one of the outputs, as depicted with the bottom waveform 18 of the averaged values of the ANTP and ANTN signals. At each voltage step where there is a high voltage transient (dV/dt), the switching amplifier 10 will generate radiated emissions for the antenna load 15.

Figure 2:
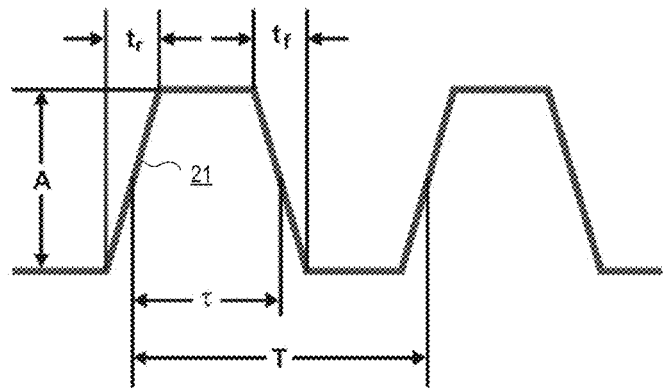
FIG. 2 depicts a typical pulse signal waveform.
Figure 3:
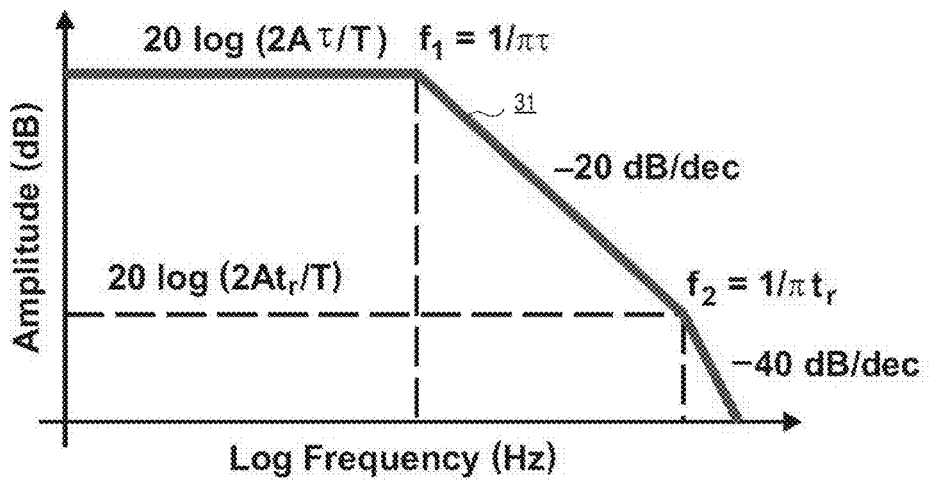
FIG. 3 depicts an amplitude/frequency plot of a spectral envelope obtained via Fourier analysis of the pulse signal waveform.

To provide additional details for an improved understanding of the limitations of conventional switching amplifier designs, reference is now made to FIG. 2 which depicts a timing diagram 20 for a typical pulse signal waveform 21 having a repetitive cycle of pulses. Each pulse is characterized signal parameters, including the oscillation period (T) for the repetitive waveform, the rise time ($t_r$), the fall time ($t_f$), the ON-time ($\tau$), and the pulse amplitude. As shown in FIG. 3 which depicts an amplitude/frequency plot 30 of a spectral envelope 31 obtained via Fourier analysis of the pulse signal waveform 21, these signal parameters A, T, $t_r$, $t_f$, τ define the spectral envelope 31 for radiated emissions for the waveform 21. In terms of time-domain parameters, the bandwidth of a periodic signal is inversely proportional to its rise and fall times and to its period of oscillation (T). When viewed in the frequency domain, a trapezoidal signal with equal rise and fall times is composed of a set of discrete harmonic signals that exist at integer multiples of the periodic signal's fundamental frequency. By calculating the amplitude of each harmonic of a given signal, the harmonic envelope can be plotted of a trapezoidal waveform to establish a spectral reference point (FIGS. 2-3). As illustrated, the energy in each harmonic falls off at 20 dB/dec after the first break point ($f_1=1/(\pi \times \tau)$). And after the second breakpoint ($f_2=1/(\pi \times t_r)$), the nth harmonic falls off at 40 dB/dec.

Figure 4:
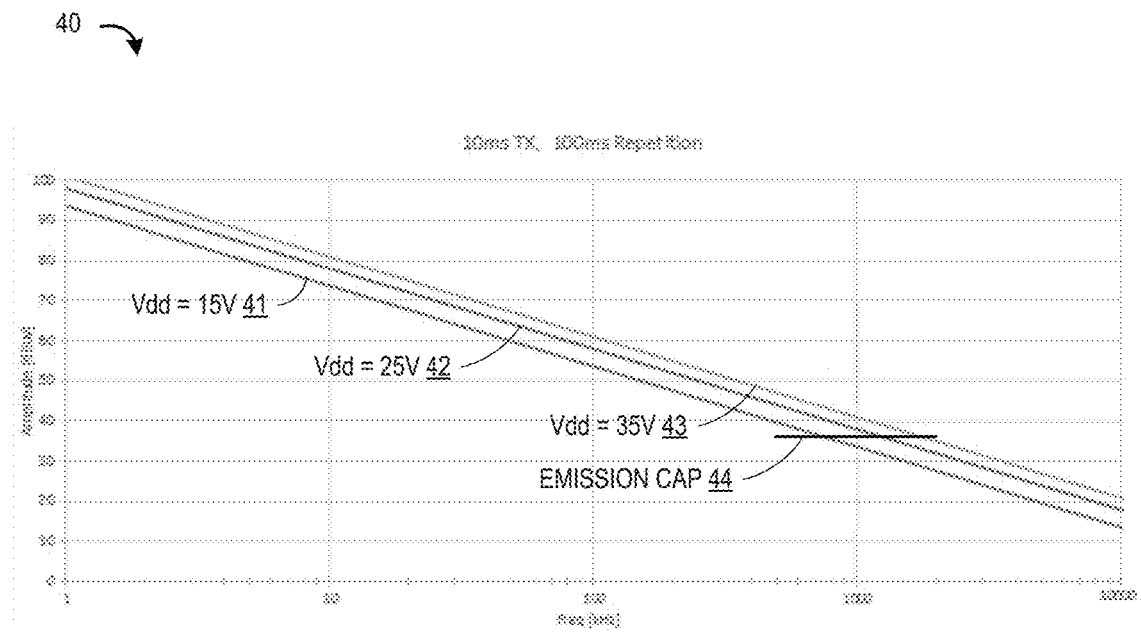
FIG. 4 depicts an amplitude/frequency plot of spectral envelopes from a portion of the emission spectrum which corresponds to typical activation and deactivation times of differential class-D amplifiers.

Referring now to FIG. 4, there is shown an amplitude/frequency plot 40 of spectral envelopes 41-43 from a portion of the emission spectrum between the first and second breakpoints $f_1$, $f_2$ which corresponds to typical activation and deactivation times of differential class-D amplifiers (e.g., 10 ms TX, 100 ms repetition) in which there is a rapid transition between deactivation and activate times ramping with a relatively fast slew-rate (e.g., 100V/us). In particular, a slew-rate of 100V/us generates transition rise and fall times $t_r=t_f=0.15$ us for the Vdd=15V supply voltage situation, with slightly longer transition rise and fall times $t_r=t_f=0.25$ us for the Vdd=25V supply voltage situation and transition rise and fall times $t_r=t_f=0.35$ us for the Vdd=35V supply voltage situation. These short transition rise and fall times pushes the 40 dB corner frequency above the AM band, as shown with the first spectral envelope 41 for a differential class-D amplifier which operates with a first supply voltage Vdd=15V. Likewise, the second spectral envelope 42 is shown for a differential class-D amplifier which operates with a second supply voltage Vdd=25V, and the third spectral envelope 43 is shown for a differential class-D amplifier which operates with a third supply voltage Vdd=35V. As seen from the spectral envelope plots 40, the emission spectrums 41-43 violate the emission cap 44 for a typical automotive standard (<36 dBuV between 500 kHz to 2 MHz). Secondly, the fixed rise and fall times of the voltage step(s) lead to emission levels 41-43 that are dependent on the class-D supply voltage in this frequency range.

Figure 5:
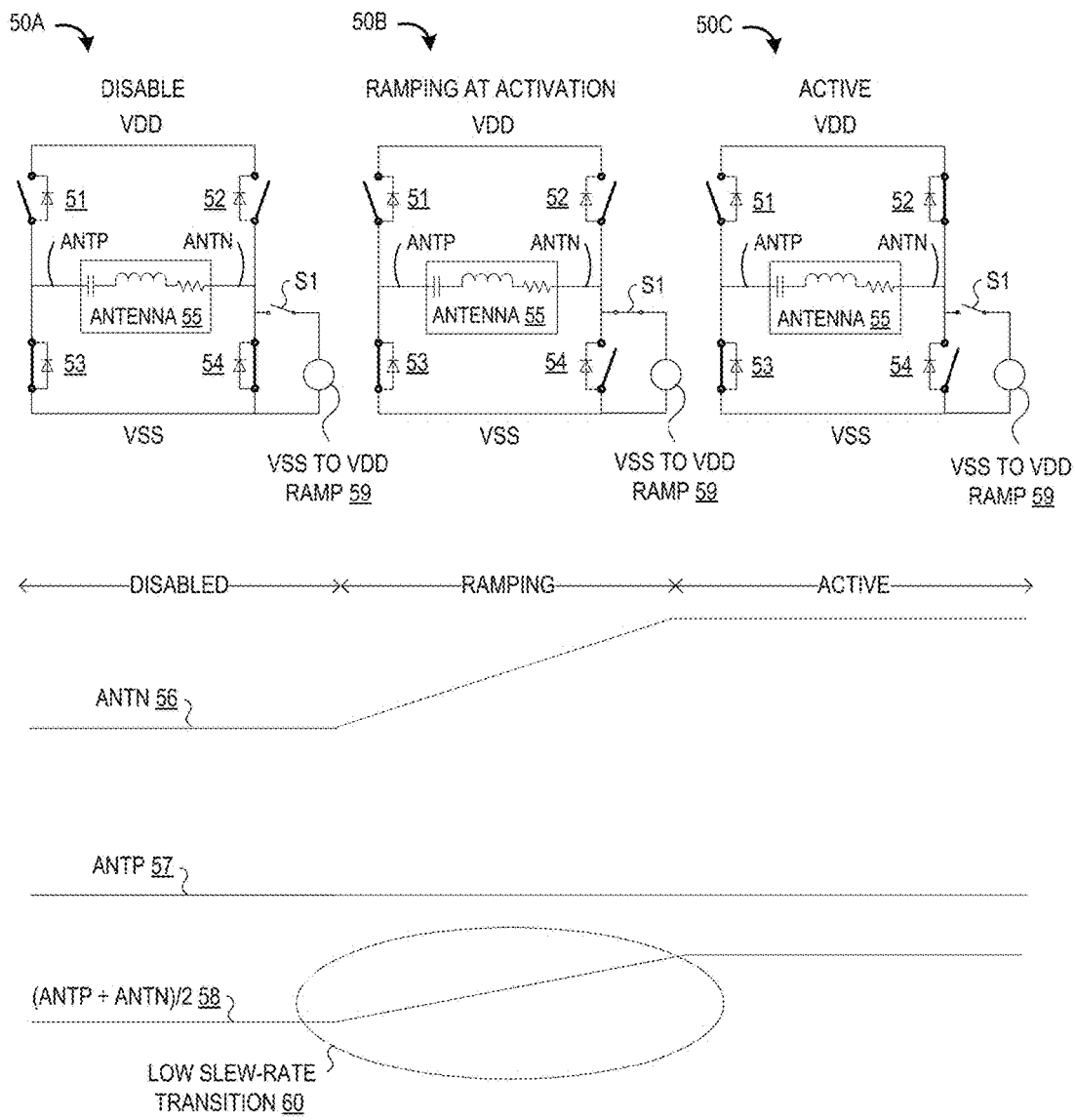
FIG. 5 illustrates a switching amplifier connected in different antenna circuit configurations along with the resulting antenna port signals generated when the switching amplifier is activated using a common mode ramping control in accordance with selected embodiments of the present disclosure.

To address these limitations and others associated with conventional switching amplifier designs, reference is now made to FIG. 5 which is a simplified circuit diagram of a switching amplifier 50 connected in different antenna circuit configurations 50A-C along with the resulting timing waveform signals 56-57 for antenna port signals ANTN, ANTP generated when the switching amplifier 50 is activated using a common mode voltage ramp generator 59 in accordance with selected embodiments of the present disclosure. As illustrated, the switching amplifier 50 is connected as the output stage of a high power driver which includes field-effect transistors (FETs, or NMOS FETs) including high-side transistors 51, 52 and low-side transistors 53, 54 connecting an antenna load 55 between first and second reference voltages Vdd, Vss. These transistors 51-54 are configured and arranged to switch with opposing phases for driving the impedance load, such as an antenna load circuit 55 with resistor, inductor, and capacitor arranged in series between two ports ANTP, ANTN. The switching amplifier 50 also includes a voltage ramp generator 59 which is connected across the low-side transistor 54 via connection switch S1 as shown to control the voltage at the antenna port ANTN so as to ramp up the negative output of the differential class-D amplifier 50 in a controlled way from ground level Vss to the supply level Vdd at activation and vice versa at deactivation.

With the antenna switching amplifier 50, current consumption is reduced by employing a polling operation which alternates between "disabled," "ramping" and "active" modes. When "disabled," the connection switch S1 is open to disconnect the voltage ramp generator 59, and the transistors 51-54 in the switching amplifier configuration 50A are connected to pull the switching amplifier outputs ANTP, ANTN down to ground level, as shown with the waveforms 56, 57 for the ANTN, ANTP amplifier outputs. When "ramping," the connection switch S1 and transistors 51-54 are connected in a "ramping" switching amplifier configuration 50B to increase the voltage on the ANTN amplifier output in a controlled way, as shown with the ANTN waveform 56. In particular, the connection switch Si is closed to connect the voltage ramp generator 59 to the ANTN amplifier output, thereby performing a controlled ramping with low slewrate to reduce the AM band emissions. After ramping up, the connection switch Si and transistors 51-54 are configured in an "active" switching amplifier configuration 50C where switching amplifier 50 is "active" but non-driven. In this configuration 50C, the connection switch S1 is open and the switches 51-54 are selectively opened and closed using an "opposing-phase electronic switching" to develop voltages on the first and second nodes ANTP, ANTN and to direct current flow through the antenna load 55. Conversely, when the switching amplifier 50 is turned back off or "disabled," the connection switch S1 and transistors 51-54 are connected in a "ramp-down" switching amplifier configuration to decrease the voltage on the ANTN amplifier output in a controlled way by opening the upper switches 51, 52 and closing the connection switch S1 so that the voltage ramp generator 59 pulls the voltage at the antenna node ANTN back to ground Vss in a controlled way.

Figure 6:
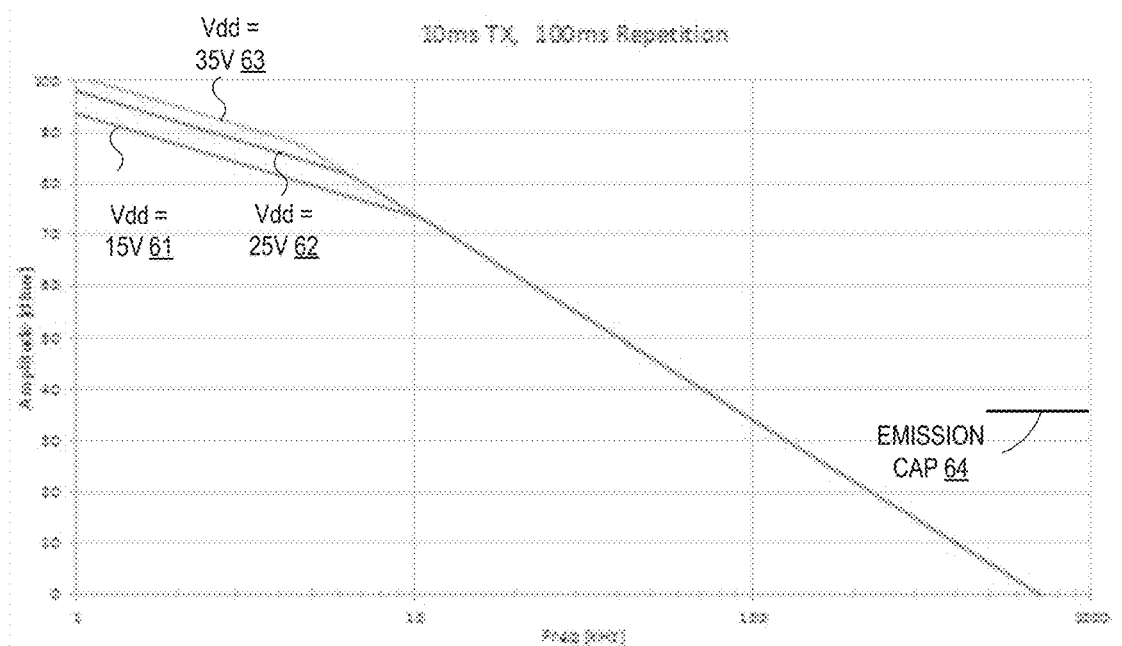
FIG. 6 depicts an emission spectrum for a differential class-D amplifier in which common mode ramping control is used during activation and deactivation in accordance with selected embodiments of the present disclosure.

By selectively connecting the voltage ramp generator 59 to the antenna port ANTN to control "ramping" transitions during activation and deactivation, the "voltage step" transitions (that result from fixed rise and fall times at the amplifier output) are replaced with a controlled voltage transition 60 having a defined slewrate, as shown with the waveform 58. In selected embodiments, the defined slew-rate may be a fixed, linear slew-rate and/or may be a non-linear ramp function, such as a raised-cosine ramp or root-raised-cosine ramp function. In turn, this reduces the voltage and current transients to reduce AM band emissions to meet the emission cap requirements for typical automotive standards. To illustrate selected performance benefits of this approach, reference is now made to FIG. 6 which depicts an emission spectrum for a differential class-D amplifier in which common mode ramping control is used during activation and deactivation in accordance with selected embodiments of the present disclosure. As depicted, a plurality of spectral envelopes 61-63 are shown from the emission spectrum when activation and deactivation ramping is performed on differential class-D amplifiers (e.g., 10 ms TX, 100 ms repetition) in which a transition phase uses a controlled ramping with relatively low slew-rate (e.g., 0.5V/us). In particular, a slew-rate of 0.5V/us leads to transition rise and fall times $t_r=t_f$ of 0.30 us, 50 us, and 70 us, respectively, for the 15V, 25V, and 35V supply voltage situations. These longer transition rise and fall times push the 40 dB corner frequency below the AM band, resulting in additional attenuation of the emitted frequencies in the AM band. In particular, the first spectral envelope 61 is for a differential class-D amplifier which operates with a first supply voltage Vdd=15V, the second spectral envelope 62 is for a differential class-D amplifier which operates with a second supply voltage Vdd=25V, and the third spectral envelope 63 is for a differential class-D amplifier which operates with a third supply voltage Vdd=35V. As seen from FIG. 6, the emission spectrums 61-63 satisfy the emission cap 65 for a typical automotive standard (<36 dBuV between 500 kHz to 2 MHz) due to the applied ramping. In addition to reducing emissions, the connection of the voltage ramp generator 59 to provide "ramping" transitions with the fixed slew-rate for activation and deactivation results in a shared AM band emission for different Class-D driver supply voltages so that emission levels are independent of the Class-D supply voltage.

Figure 7:
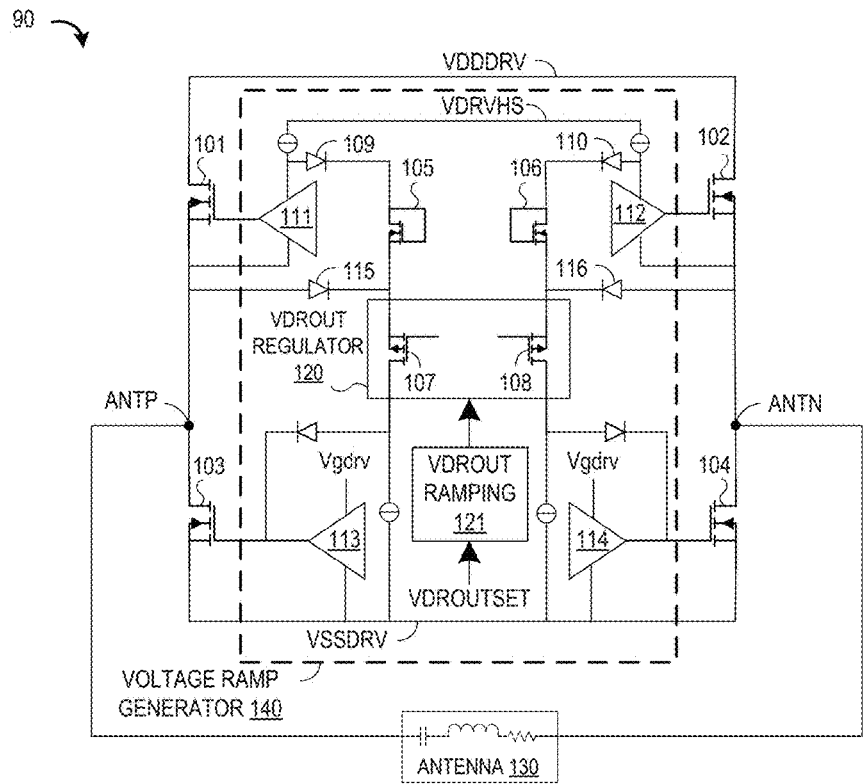
FIG. 7 depicts a simplified block diagram of a switching amplifier circuit having supply voltage ramp control circuitry in accordance with selected embodiments of the present disclosure.

To provide additional details for an improved understanding of selected embodiments of the present disclosure, reference is now made to FIG. 7 which depicts a simplified block diagram of a switching amplifier circuit 90 having supply voltage ramp control circuitry in accordance with selected embodiments of the present disclosure. As with the switching amplifier 50 FIG. 5, the switching amplifier circuit 90 includes FET switching transistors 101-104 which are connected and arranged to drive the impedance load, such as an antenna load circuit 130, connected between two ports ANTP, ANTN under control of a voltage ramp generator 140 which can adjust the maximum supply voltage of the gate driver circuitry associated with the high-side switch(es) 101, 102. The voltage ramp generator 140 includes circuitry for generating supply voltages of the gate driver circuitry 111, 112 associated with the high-side switches 101, 102. In particular, the voltage supply terminals to the gate drivers 111, 112 for the high-side FETs 101, 102 are controlled by a corresponding impedance circuit (e.g., diodes 109, 110 and FET 105, 106) so that the supply voltage to the gate drivers have their maximum supply voltage adjusted based on a selected magnitude of voltage drop (e.g., two threshold voltage drops) effected by the serially-arranged component(s) in the impedance circuit (e.g., diode 109 and FET 105). The voltage ramp generator 140 also includes circuitry for generating supply voltages for the gate drivers 113, 114 for the low-side FETs 103, 104, including the gate drive voltage Vgdrv and LF_Driver ground node (VSSDRV). In addition, the voltage ramp generator 140 includes circuitry for controlling the Vdrout output amplitude level on either the antenna ports ANTP, ANTN. In selected example embodiments, a driven output voltage Vdrout regulator 120 includes switching transistor FETs 107, 108 which may each be connected over a corresponding diode 115, 116 to an antenna port ANTP, ANTN in response to FET gate voltage signal generated by the Vdrout ramping generator 121 under control of the voltage setting signal Vdroutset.

Again using an amplitude-controlled (Class-D) driver in this example switching amplification circuit 90, the voltage ramp generator 140 may include a first amplifier (not shown) connected to the gate of the FET 107, where the amplifier has a first input connected at the drain of the FET 107 and a second input connected to the ramped voltage source 121. In similar fashion, the voltage ramp generator 140 may include a second amplifier (not shown) connected to the gate of the FET 108, where the amplifier has a first input connected at the drain of the FET 108 and a second input connected to the ramped voltage source 121. In this configuration, the low side FET 104 (103) is used to sink current from the ANTN (ANTP) node in case this voltage would be higher than the desired VDROUT ramping voltage. And in case the voltage on the ANTN node would be too high, a current will flow through the FET 108 which creates a gate-source voltage for the low side FET 104, thereby turning ON the FET 104. In addition, the Vdrout regulator 120 is connected to ramp either output ANTP, ANTN of the differential classD amplifier 90 in a controlled way from ground level Vssdrv to the Vdroutset supply voltage at activation during a "ramp-up" stage. And during deactivation, the Vdrout regulator 120 is connected to ramp the outputs ANTP, ANTN from the Vdroutset supply voltage to the ground level Vssdrv during a "ramp-down" stage. By controlling ramping to have a low slew-rate, AM band emissions from the switching amplifier 90 are reduced.

Figure 8:
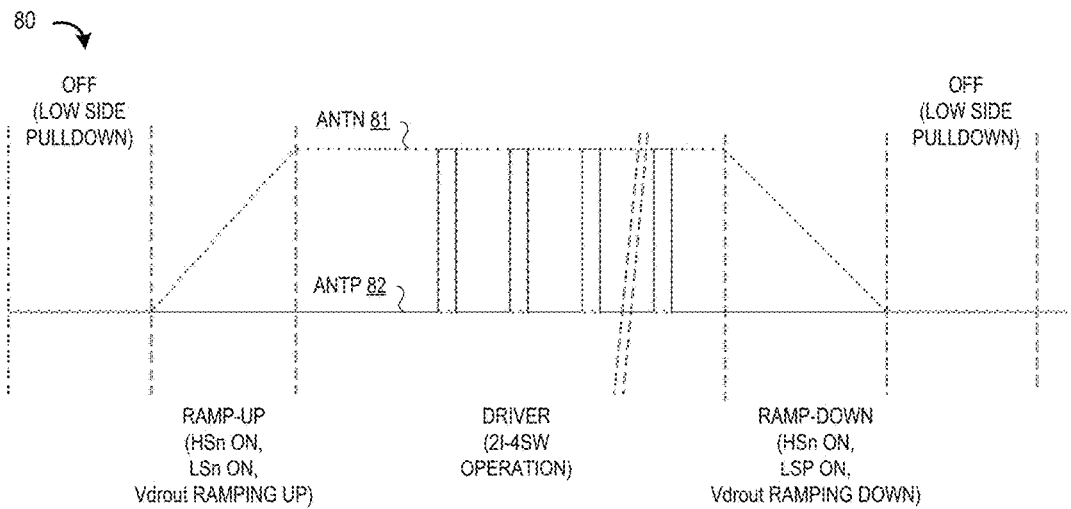
FIG. 8 depicts a timing diagram for waveform signals at selected terminals of the switching amplifier circuit depicted in FIG. 7.

To provide additional details for an improved understanding of selected embodiments of the present disclosure, reference is now made to FIG. 8 which depicts a timing diagram 80 for ANTN, ANTP waveform signals 81, 82 at selected terminals of the switching amplifier circuit 90 depicted in FIG. 7. During an "off" phase, the switching amplifier circuit 90 is disabled and the ANTN, ANTP waveform signals 81, 82 are each pulled down to the low side (e.g., Vssdrv). During a "ramp-up" phase, the Vdrout regulator 120 ramps up the ANTN waveform signal 81 in a controlled fashion from the low side reference voltage (e.g., Vssdrv) to the high side reference voltage (e.g, Vdddrv) while the ANTP waveform signal 82 stays pulled down. For example, during ramping, the switching transistor 108 in the Vdrout regulator 120 is turned ON with a controlled gate voltage to ramp up the ANTN voltage and turn ON the high-side transistor 102 under control of the gate voltage (provided from the source of the switching transistor 108) while the high-side transistor 101 and low-side transistor 104 are turned OFF and the low-side transistor 103 is ON. During the "driver" phase, the switching transistors 107, 108 are turned OFF, and the switching transistors 101-104 are controlled to switch with opposing phases for driving the impedance load 130 so that the ON and OFF phases of the ANTN voltage 81 alternate in opposite phase from the ON and OFF phases of the ANTP voltage 82. Upon deactivation of the "driver" phase, a "ramp-down" phase occurs where the Vdrout regulator 120 ramps down the ANTN waveform signal 81 in a controlled fashion from the high side reference voltage (e.g, Vdddrv) to the low side reference voltage (e.g., Vssdrv) while the ANTP waveform signal 82 stays pulled down. Finally, the switching amplifier circuit 90 enters an "off" phase where the ANTN, ANTP waveform signals 81, 82 are each pulled down to the low side (e.g., Vssdrv).

Certain aspects of the present disclosure can be embodied in switching amplifiers that drive wireless transmission in low-power environments and in which signal loss is susceptible to moderate levels of noise. One such environment is automotive electronics where one of what is typically many co-located automobiles include (disparate and/or similarly-constructed) wireless transmissions circuits where noise and signal interferences are concerns due to transmitted (modulated) signals competing in the same wireless spectrum and to the power supplies for such amplification circuits being sourced by automotive batteries. One practical scenario in this automotive context is where such wireless transmissions from each amplification circuit are implemented with a carrier frequency of at least ten kilohertz (10 kHz) for receipt and demodulation by a key-fob circuit. In this type of environment, one such application employs the above-characterized amplification circuitry arranged with an antenna load having an inductor through which the modulated carrier signals are sent wirelessly for receipt and demodulation by another circuit. While signal integrity can typically be enhanced by increasing signal power (e.g., signal-to-noise ratio), in this automotive environment minimizing signal power (without loss of signal integrity) can be important for various reasons including, for example, the on-going increase of dynamic range of LF transmission system (to increase the communication distance) and to mitigate the creation of unnecessary interference which would likely impact the wireless transmissions of other neighboring circuits. Accordingly, the above-discussed ramping voltage control circuit is used to limit high voltage transients (dV/dt)), thereby reducing radiated emissions for the antenna in such applications.

By now it should be appreciated that there has been provided a switching amplifier circuit, apparatus, method, and system for minimizing AM band emissions in passive keyless entry systems. In the disclosed embodiments, the switching amplifier circuit includes first and second high side electronic switches configured and arranged to connect a first reference voltage to, respectively, first and second output nodes in response to first and second gating control signals during an active phase of operation when the first and second gating control signals are opposing-phase signals, and to disconnect the first reference voltage from the first and second output nodes in response to the first and second gating control signals during a disabled phase of operation. In addition, the switching amplifier circuit includes first and second low side electronic switches configured and arranged to connect a second reference voltage to, respectively, the first and second output nodes in response to the first and second gating control signals during the active phase of operation, and to pull the both the first and second output nodes to the second reference voltage during the disabled phase of operation. In selected embodiments, the high side and low side electronic switches are part of a Class D amplifier connected to drive an impedance-based antenna drive circuit to convey signals wirelessly from the switching amplifier circuit for receipt by another circuit. The switching amplifier circuit also includes an output drive circuit configured and arranged to provide a ramped output voltage drive signal to the first output node while the second output node is connected over the second low side electronic switch to the second reference voltage during a transition phase of operation between the disabled phase and active phase, where the ramped output voltage drive signal is characterized by a predetermined slew-rate between the second reference voltage and the first reference voltage over a specified time interval. As disclosed herein, the predetermined slew-rate is controlled to reduce or eliminate AM band emissions from the switching amplifier circuit. In selected embodiments, the switching amplifier circuit includes an impedance-based load comprising an inductor coupled between the first and second output nodes, where the impedance-based load is configured and arranged to convey modulated signals wirelessly from the switching amplifier circuit for receipt and demodulation by another circuit. In such embodiments, the impedance-based load may be configured and arranged to convey modulated signals wirelessly, at carrier frequency of at least ten kilohertz, from the switching amplifier circuit for receipt and demodulation by a key-fob circuit. In some embodiments, the transition phase of operation is a ramp-up transition phase during which the output drive circuit is configured and arranged to provide a ramped output voltage drive signal which rises from the second reference voltage to the first reference voltage. In other embodiments, the transition phase of operation is a ramp-down transition phase during which the output drive circuit is configured and arranged to provide a ramped output voltage drive signal which falls from the first reference voltage to the second reference voltage.

In another form, there is provided a circuit, apparatus, method, and system for minimizing AM band emissions in passive keyless entry systems. In the disclosed embodiments, the circuit includes a switching amplifier, switch driver circuit, and output drive circuit. The switching amplifier includes a high side switching transistor and low side switching transistor connected in series between first and second supply voltage lines with an output connection between the high side and slow side switching transistors for driving an output load, which may include an impedance-based load having an inductor coupled between first and second output connection nodes. As disclosed herein, the impedance-based load is configured and arranged to convey modulated signals wirelessly, at carrier frequency of at least ten kilohertz, from the circuit for receipt and demodulation by a key-fob circuit. In selected embodiments, the switching amplifier includes first and second high side electronic switches configured and arranged to connect the first supply voltage line to, respectively, first and second output connection nodes of the output driving circuit in response to first and second gating control signals during an active phase of operation when the first and second gating control signals are opposing-phase signals, and to disconnect the first supply voltage line from the first and second output connection nodes in response to the first and second gating control signals during the disabled phase of operation. In such embodiments, the switching amplifier also includes first and second low side electronic switches configured and arranged to connect the second supply voltage line to, respectively, the first and second output connection nodes in response to the first and second gating control signals during the active phase of operation, and to pull the both the first and second output connection nodes to the second supply voltage line during the disabled phase of operation. In selected embodiments, the first and second high side electronic switches and first and second low side electronic switches are part of a Class D amplifier connected to drive an impedance-based antenna drive circuit to convey signals wirelessly from the circuit for receipt by another circuit. The switch driver circuit is configured to drive the high side and slow side switching transistors with first and second respective control signals during an active phase common mode of operation to alternately connect the first supply voltage line and the second supply voltage line to the output connection, and to disconnect the first and second voltage lines from the output connection during a disabled phase of operation. The output drive circuit is configured and arranged to provide a ramped output voltage drive signal to the output connection while the output load is connected to the second supply line voltage during a transition phase of operation between the disabled phase and active phase. In particular, the ramped output voltage drive signal is characterized by a predetermined slew-rate between the second supply voltage line and the first supply voltage line over a specified time interval. In selected embodiments, the predetermined slew-rate is controlled to reduce or eliminate AM band emissions from the circuit, and may be a fixed, linear slew-rate of approximately 0.5V/us. As disclosed herein, the transition phase of operation may be a ramp-up transition phase during which the output drive circuit is configured and arranged to provide a ramped output voltage drive signal which rises from the second supply voltage line to the first supply voltage line. In other embodiments, the transition phase of operation may be a ramp-down transition phase during which the output drive circuit is configured and arranged to provide a ramped output voltage drive signal which falls from the first supply voltage line to the second supply voltage line.

In yet another form, there is provided a wireless communication system, circuit, apparatus, and method for minimizing AM band emissions in passive keyless entry systems. In the disclosed embodiments, the wireless communication system includes a key-fob circuit configured and arranged to receive and respond to modulated signals wirelessly. In addition, the wireless communication system includes a Class-D switching amplifier circuit connected to drive an impedance-based load connected between first and second output nodes without AM band emissions. In selected embodiments, the impedance-based load comprises an inductor coupled between first and second output nodes, where the impedance-based load is configured and arranged to convey modulated signals wirelessly from the Class-D switching amplifier circuit for receipt and demodulation by the key-fob circuit. In particular, the impedance-based load may be configured and arranged to convey modulated signals wirelessly, at carrier frequency of at least ten kilohertz for receipt and demodulation by the key-fob circuit. As disclosed, the Class-D switching amplifier circuit includes first and second high side electronic switches configured and arranged to connect a first reference voltage to, respectively, the first and second output nodes in response to first and second gating control signals during an active phase of operation when the first and second gating control signals are opposing-phase signals, and to disconnect the first reference voltage from the first and second output nodes in response to the first and second gating control signals during a disabled phase of operation. In addition, the Class-D switching amplifier circuit includes first and second low side electronic switches configured and arranged to connect a second reference voltage to, respectively, the first and second output nodes in response to the first and second gating control signals during the active phase of operation, and to pull the both the first and second output nodes to the second reference voltage during the disabled phase of operation. Finally, the Class-D switching amplifier circuit includes an output node drive circuit configured and arranged to provide a ramped output voltage drive signal to one of the first and second output nodes while the other of the first and second output nodes is connected to the second reference voltage during a transition phase of operation between the disabled phase and active phase. As disclosed, the ramped output voltage drive signal is characterized by a predetermined slew-rate between the second reference voltage and the first reference voltage over a specified time interval. In selected embodiments, the predetermined slew-rate is a fixed slew-rate of approximately 0.5V/us. In other embodiments, the predetermined slew-rate is a non-linear slew-rate.

Because selected embodiments implementing the present invention are, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure. It should also be understood that the terminology is used for notational convenience only and that in actual use the disclosed structures may be oriented different from the orientation shown in the figures. Thus, the terms should not be construed in a limiting manner. In addition, it will be appreciated that certain terms may have some overlap in meaning. One example in this regard is the term an "electrode" which might be considered part of a "wire" does not limit a function of a component or the related circuitry. In many contexts, a design may characterize electrical connections with "electrode" being used as part of a "wiring" and in other designs, vice versa. Further, the term "electrode" or "wiring" can also mean a combination of a plurality of "electrodes" and "wirings" formed in an integrated manner. Also, when illustrating exemplary designs with use of a FET, the functions of the FET's source and drain might be switched depending on operation conditions and relative voltage polarities, for example, when a transistor having opposite polarity is employed or the direction of current flow is changed in circuit operation, reference to the term "source" or "source terminal" of the FET can be interchanged with "drain" or "drain terminal." Accordingly, the terms "source" and "drain" can be switched in this Specification, and similarly, these terms might also be used interchangeably with the terms "source/drain" and "drain/source".

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

Although the described exemplary embodiments disclosed herein are directed to methods and systems for controlling the ramp voltage used with activation and deactivation sequences in a differential class-D switching amplifier circuit, system, architecture, and methodology, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switching amplifier circuit comprising:
    first and second high side electronic switches configured and arranged to connect a first reference voltage to, respectively, first and second output nodes in response to first and second gating control signals during an active phase of operation when the first and second gating control signals are opposing-phase signals, and to disconnect the first reference voltage from the first and second output nodes in response to the first and second gating control signals during a disabled phase of operation;
    first and second low side electronic switches configured and arranged to connect a second reference voltage to, respectively, the first and second output nodes in response to the first and second gating control signals during the active phase of operation, and to pull the both the first and second output nodes to the second reference voltage during the disabled phase of operation; and
    an output drive circuit configured and arranged to provide a ramped output voltage drive signal to the first output node while the second output node is connected over the second low side electronic switch to the second reference voltage during a transition phase of operation between the disabled phase and active phase,
    where the ramped output voltage drive signal is characterized by a predetermined slew-rate between the second reference voltage and the first reference voltage over a specified time interval.

2. The switching amplifier circuit of claim 1, wherein the first and second high side electronic switches and first and second low side electronic switches are pan of a Class D amplifier connected to drive an impedance-based antenna drive circuit to convey signals wirelessly from the switching amplifier circuit for receipt by another circuit.

3. The switching amplifier circuit of claim 1, further comprising an impedance-based load comprising an inductor coupled between the first and second output nodes, where the impedance-based load is configured and arranged to convey modulated signals wirelessly from the switching amplifier circuit for receipt and demodulation by another circuit.

4. The switching amplifier circuit of claim 3, where the impedance-based load is configured and arranged to convey modulated signals wirelessly, at carrier frequency of at least ten kilohertz, from the switching amplifier circuit for receipt and demodulation by a key-fob circuit.

5. The switching amplifier circuit of claim 1, where the transition phase of operation is a ramp-up transition phase during which the output drive circuit is configured and arranged to provide a ramped output voltage drive signal which rises from the second reference voltage to the first reference voltage.

6. The switching amplifier circuit of claim 1, where the transition phase of operation is a ramp-down transition phase during which the output drive circuit is configured and arranged to provide a ramped output voltage drive signal which falls from the first reference voltage to the second reference voltage.

7. The switching amplifier circuit of claim 1, where the predetermined slew-rate is controlled to reduce or eliminate AM band emissions from the switching amplifier circuit.

8. A circuit comprising:
    a switching amplifier comprising a high side switching transistor and low side switching transistor connected in series between first and second supply voltage lines;
    an output connection between the high side and slow side switching transistors for driving an output load;
    a switch driver circuit configured to drive the high side and slow side switching transistors with first and second respective control signals during an active phase common mode of operation to alternately connect the first supply voltage line and the second supply voltage line to the output connection, and to disconnect the first and second voltage lines from the output connection during a disabled phase of operation; and
    an output drive circuit configured and arranged to provide a ramped output voltage drive signal to the output connection while the output load is connected to the second supply line voltage during a transition phase of operation between the disabled phase and active phase,
    where the ramped output voltage drive signal is characterized by a predetermined slew-rate between the second supply voltage line and the first supply voltage line over a specified time interval.

9. The circuit of claim 8, where the switching amplifier comprises:
    first and second high side electronic switches configured and arranged to connect the first supply voltage line to, respectively, first and second output connection nodes of the output driving circuit in response to first and second gating control signals during an active phase of operation when the first and second gating control signals are opposing-phase signals, and to disconnect the first supply voltage line from the first and second output connection nodes in response to the first and second gating control signals during the disabled phase of operation; and
    first and second low side electronic switches configured and arranged to connect the second supply voltage line to, respectively, the first and second output connection nodes in response to the first and second gating control signals during the active phase of operation, and to pull the both the first and second output connection nodes to the second supply voltage line during the disabled phase of operation.

10. The circuit of claim 9, wherein the first and second high side electronic switches and first and second low side electronic switches are part of a Class D amplifier connected to drive an impedance-based antenna drive circuit to convey signals wirelessly from the circuit for receipt by another circuit.

11. The circuit of claim 8, wherein the output load comprises an impedance-based load comprising an inductor coupled between the first and second output connection nodes.

12. The circuit of claim 11, where the impedance-based load is configured and arranged to convey modulated signals wirelessly, at carrier frequency of at least ten kilohertz, from the circuit for receipt and demodulation by a key-fob circuit.

13. The circuit of claim 8, where the transition phase of operation is a ramp-up transition phase during which the output drive circuit is configured and arranged to provide a ramped output voltage drive signal which rises from the second supply voltage line to the first supply voltage line.

14. The circuit of claim 8, where the transition phase of operation is a ramp-down transition phase during which the output drive circuit is configured and arranged to provide a ramped output voltage drive signal which falls from the first supply voltage line to the second supply voltage line.

15. The circuit of claim 8 where the predetermined slew-rate is controlled to reduce or eliminate AM band emissions from the circuit.

16. The circuit of claim 8 where predetermined slew-rate is a fixed, linear slew-rate of approximately 0.5V/us.

17. A wireless communication system comprising:
 a key-fob circuit configured and arranged to receive and respond to modulated signals wirelessly; and
 a Class-D switching amplifier circuit connected to drive an impedance-based load connected between first and second output nodes without AM band emissions, comprising:
 first and second high side electronic switches configured and arranged to connect a first reference voltage to, respectively, the first and second output nodes in response to first and second gating control signals during an active phase of operation when the first and second gating control signals are opposing-phase signals, and to disconnect the first reference voltage from the first and second output nodes in response to the first and second gating control signals during a disabled phase of operation; and
 first and second low side electronic switches configured and arranged to connect a second reference voltage to, respectively, the first and second output nodes in response to the first and second gating control signals during the active phase of operation, and to pull the both the first and second output nodes to the second reference voltage during the disabled phase of operation; and
 an output node drive circuit configured and arranged to provide a ramped output voltage drive signal to one of the first and second output nodes while the other of the first and second output nodes is connected to the second reference voltage during a transition phase of operation between the disabled phase and active phase,
 where the ramped output voltage drive signal is characterized by a predetermined slew-rate between the second reference voltage and the first reference voltage over a specified time interval.

18. The wireless communication system of claim 17 where the predetermined slew-rate is a fixed, linear slew-rate of approximately 0.5V/us.

19. The wireless communication system of claim 17 where the predetermined slew-rate is a non-linear slew-rate.

20. The wireless communication system of claim 17, where the impedance-based load comprises an inductor coupled between the first and second output nodes, where the impedance-based load is configured and arranged to convey modulated signals wirelessly from the Class-D switching amplifier circuit for receipt and demodulation by the key-fob circuit.

21. The wireless communication system of claim 19, where the impedance-based load is configured and arranged to convey modulated signals wirelessly, at carrier frequency of at least ten kilohertz for receipt and demodulation by the key-fob circuit.

\* \* \* \* \*